United States Patent [19]
Chern et al.

[11] Patent Number: 5,266,821
[45] Date of Patent: Nov. 30, 1993

[54] CHIP DECOUPLING CAPACITOR

[75] Inventors: Wen-Foo Chern; Ward D. Parkinson; Thomas M. Trent; Kevin G. Duesman, all of Boise, Id.

[73] Assignee: Micron Technology, Inc., Boise, Id.

[21] Appl. No.: 970,528

[22] Filed: Nov. 2, 1992

Related U.S. Application Data

[63] Continuation of Ser. No. 703,235, May 20, 1991, abandoned, which is a continuation-in-part of Ser. No. 529,679, May 28, 1990, abandoned, which is a continuation of Ser. No. 200,673, May 31, 1988, abandoned.

[51] Int. Cl.$^5$ ........................................... H01L 27/02
[52] U.S. Cl. .................... 257/312; 257/379; 257/532; 257/596
[58] Field of Search ............... 257/312, 379, 532, 596, 257/598

[56]  References Cited

U.S. PATENT DOCUMENTS

| | | |
|---|---|---|
| 4,164,751 | 8/1979 | Tasch, Jr. .......................... 357/23.6 |
| 4,427,989 | 1/1984 | Anantha et al. ..................... 357/789 |
| 4,477,736 | 10/1984 | Onishi .................................. 257/312 |
| 4,604,639 | 8/1986 | Kinoshita .......................... 357/23.6 |
| 4,691,304 | 9/1987 | Hori et al. ......................... 357/23.6 |
| 4,737,830 | 4/1988 | Patel et al. ......................... 357/23.6 |
| 4,780,846 | 10/1988 | Tanabe et al. ..................... 357/23.6 |
| 4,835,416 | 5/1989 | Miller ............................... 357/23.13 |

FOREIGN PATENT DOCUMENTS 61-73367   4/1986   Japan ...................................... 357/51

Primary Examiner—J. Carroll
Attorney, Agent, or Firm—Stanley N. Protigal

[57] ABSTRACT

An extensive network of N-channel transistor formed capacitor, with one node tie directly to $V_{cc}$ power bus and the other node directly $V_{ss}$ power bus, is implemented throughout all open space available on the whole silicon chip (memory as well as logic chip), particularly those directly underneath the metal power bus to achieve an on-chip power bus decoupling capacitor with capacitance in excess of 0.001 $\mu F$.

25 Claims, 4 Drawing Sheets

CHIP DECOUPLING CAPACITOR

This is a continuation to U.S. Pat. application Ser. No. 07/703,235, filed May 20, 1991, now abandoned, which is a continuation-in-part to U.S. Pat. application Ser. No. 07/529,679, filed May 29, 1990, now abandoned, which is a continuation of U.S. Pat. application Ser. No. 07/200,673, filed May 31, 1988, now abandoned.

FIELD OF THE INVENTION

This invention relates to semiconductor devices, and more specifically to circuit connections on semiconductor devices and to the reduction of voltage transients on the semiconductor devices.

BACKGROUND OF THE INVENTION

Semiconductor circuit devices, including integrated circuit devices such as DRAMS and SRAMS, switch internal leads and output drivers on and off as a part of their operation.

Such semiconductor devices typically take the form of a semiconductor die. The die is generally attached to a lead frame within a package, by means of fine gold wires, as shown in FIG. 1. These fine gold wires function as lead frame connection wires. The lead frame and die is then encapsulated, in the form of the familiar integrated circuit "chip". The packaged chip is then able to be installed on a circuit board by any number of techniques, such as socketing and soldering.

The gold connection wires, because of their length relative to their diameter, function as inductors. As current through the gold connection wires is alternately switched on or off, voltage spikes occur. In order to reduce the effects of voltage transients, external capacitors have been installed either within the semiconductor package or on a circuit board onto which the semiconductor packages are installed. In either case, the capacitor is on an opposite side of the lead frame connection wire from the semiconductor die. This establishes the circuit shown in FIG. 2. This equivalent circuit represents an inappropriate arrangement for filtering voltage transients from affecting the box, which represents the semiconductor. Therefore, it is desirable to provide capacitance on the other side of the inductor, i.e., the side of the inductor that the device is connected to.

Most semiconductors, including all DRAMS, include capacitors. For example, a 4 Meg DRAM includes over 4 million capacitors each. For the purpose of storing individual bits of information, these capacitors are accessed by connections through access transistors and sense amps, connected through a periphery circuit. The present invention concerns adding filter capacitance to such devices in order to provide protection from voltage transients which may not be afforded by what may be millions of other capacitors on the semiconductor device.

Semiconductor circuit devices are designed with an architecture which places their functional circuitry within a confined area, usually rectangularly shaped. At the perimeter (either outside or inside) of the rectangularly shaped area are a series of contact pads and a substantial amount of chip area which is occupied by conductor busses, but is unoccupied by active circuit devices. Unlike many of the circuit elements on a semiconductor circuit device, filter capacitors need not be built to precise specifications. It is therefore, possible to utilize perimeter areas and portions of semiconductor chip area which form major border areas between active portions of the semiconductor circuit device.

There is a significant advantage in providing that any added circuit elements be on the same side of a chip wafer as other circuit elements, because of manufacturing techniques and tolerances. Conventionally, semiconductor circuit devices are arrayed on one side of a die wafer. It would therefore be advantageous to design a filtering element which would not significantly expand the die area (chip area) required for each die.

There is a certain portion of the die area which is not particularly suitable for active circuitry. This includes chip area occupied by bus lines, which are normally metallization which overlays most or all of the patterned layers which make up the active circuitry on the die.

SUMMARY OF THE INVENTION

In accordance with the present invention, a semiconductor circuit device is formed in which border areas, including perimeter border areas and intermediate border areas, are capacitors. The filter capacitors are in electrical communication with lead frame connection pads, to which the lead frame connection wires are attached. This establishes a filter capacitance in excess of 0.001 $\mu F$ on the semiconductor device side of the lead frame connection wires, thereby filtering voltage transients which may be generated by the lead frame connection wires.

The capacitor may be a depletion mode capacitor occupying a space defined by a plurality of conductive lines, such as the bus lines. One of these conductive lines may be connected, as a regulated conductive line, to a voltage regulating circuit.

DETAILED DESCRIPTION OF THE PREFERRED EMBODIMENTS

Figure 1:
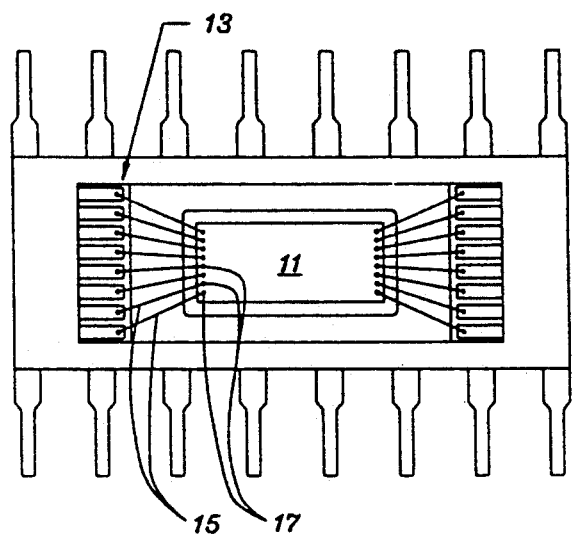
FIG. 1 shows a top view of a semiconductor device attached by pads to the lead frame.
Figure 2:
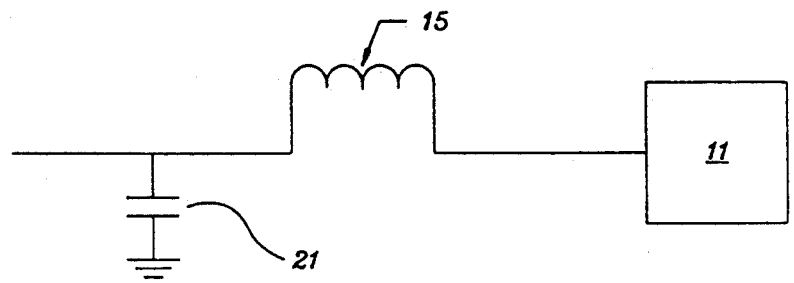
FIG. 2 shows an equivalent circuit of a semiconductor device connected to a lead wire and an off-chip capacitor.
Figure 3:
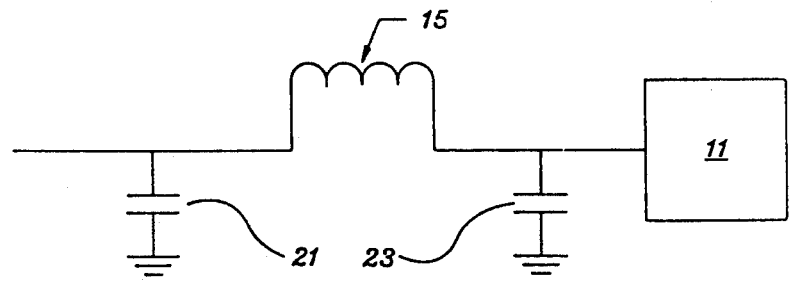
FIG. 3 shows an equivalent circuit of a semiconductor circuit device connected through a lead frame connection wire and having an on-chip decoupling capacitor.

Referring to FIG. 1, a semiconductor device includes a die 11 which is connected to a leadframe 13 by a priority of lead wires 15. The lead wires 15 are attached to the die 11 at pads or contact points 17. The lead wires 15 function as inductors, as schematically shown in FIGS. 2 and 3. While an external capacitor 21 is often provided, appropriate filter capacitance would be located on the die side of the lead wire 15, as schematically shown in Figure at 23.

Figure 4:
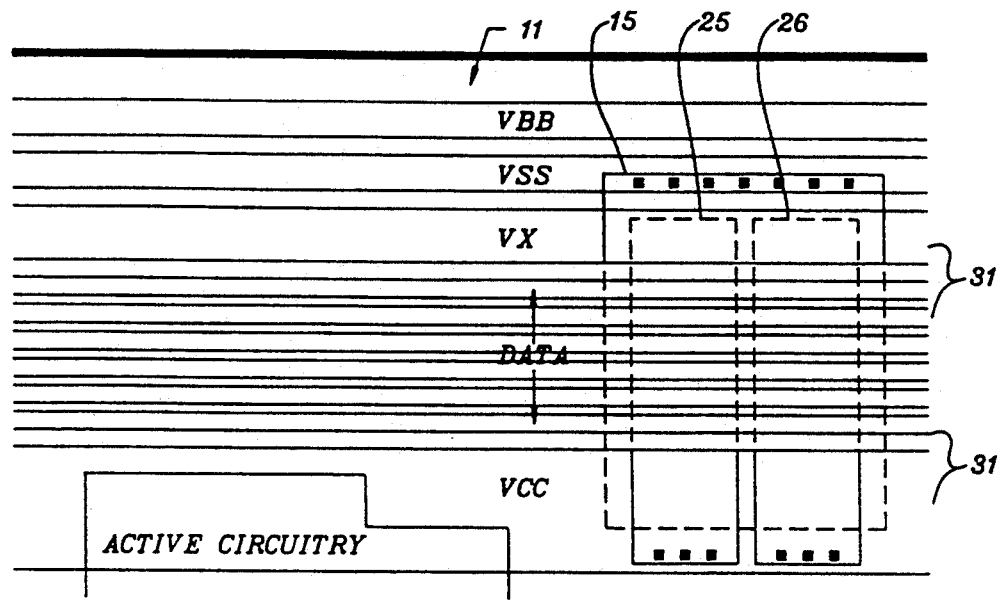
FIG. 4 shows a top view of a semiconductor, which incorporates a decoupling capacitor.

FIG. 4 shows details of one end of the die 11 constructed with the present invention, a pair of capacitors are defined by an active area of the substrate 15 and a polysilicon (poly) layer which is formed into strips 25, 26. The active area 15 is in electrical communication with a first bus line $V_{ss}$. The poly strips 25, 26 are in electrical communication with a second bus line $V_{cc}$. Oxide is used to separate the Poly 25, 26 from the active area 15.

The capacitors defined by the strips 25, 26 are on a location of the circuit die II which underlies $V_x$ and $V_{cc}$, as well as other buses 31. The buses 31 (including $V_x$ and $V_{cc}$) are typically metallization layers, and real estate occupied by the buses 31 cannot be used for most active circuitry. This is because active circuitry requires utilization of layers as outputs, which in this case is prevented by the buses 31 which are used for routing signals from the left end to the right end of the chip.

Figure 5:
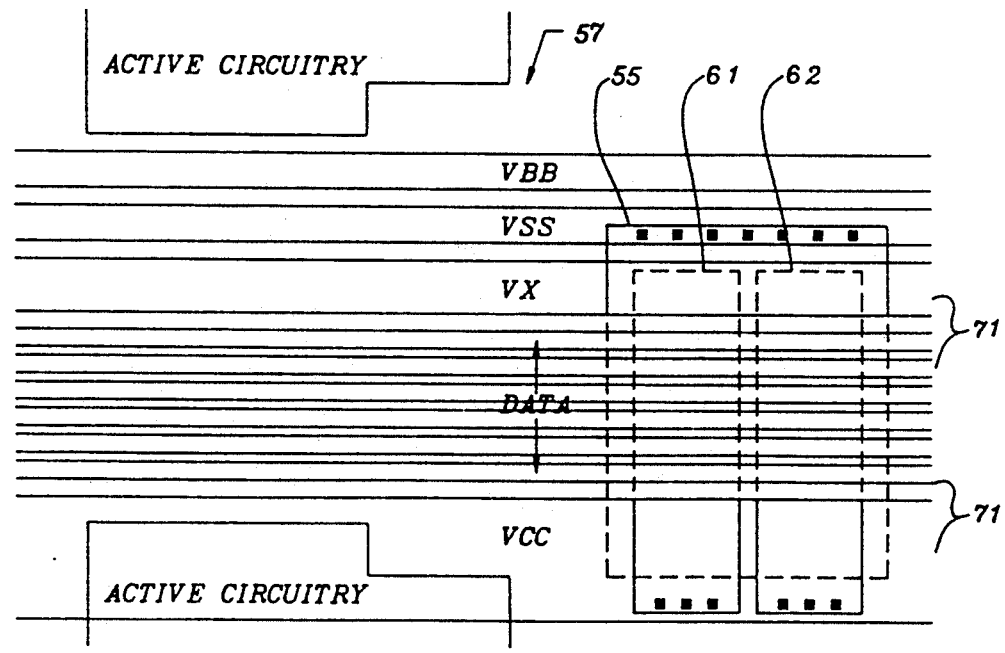
FIG. 5 shows a top view of a semiconductor device, in which a decoupling capacitor is placed along an intermediate boundary area of the chip architecture.

FIG. 5 shows a configuration in which a pair of capacitors are defined by an active substrate area 55 along an intermediate portion of a semiconductor die 57. A plurality of poly strips 61–62, superimposed over the active poly area define a plurality of capacitors. Circuit buses 71 are superimposed over the capacitors 61–62, so that the capacitors 61–62 do not occupy real estate that could be used for most active circuit devices.

The invention has been described in terms of connection to circuit busses which have external connections. It is possible that an additional circuit may be placed between the bus and an external connection. A likely example of such an additional circuit would a voltage regulating circuit. It is possible to connect the capacitor to a bus which extends between such an additional circuit and a main portion of the integrated circuit device.

Figure 6:
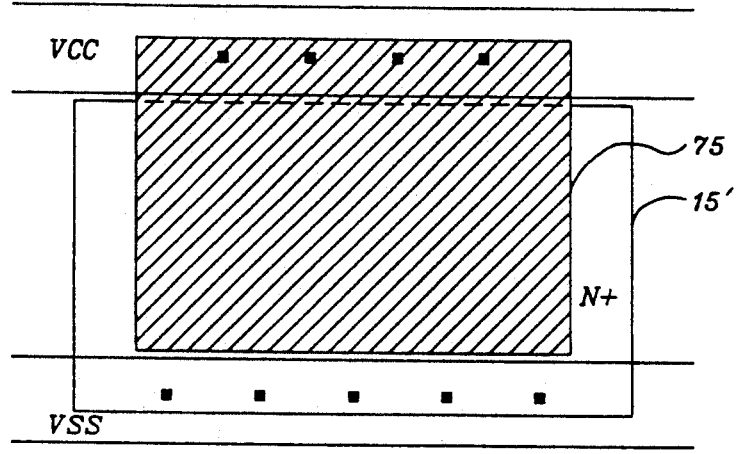
FIGS. 6 and 7 show connection arrangements for N-channel and P-channel capacitor, respectively.
Figure 7:
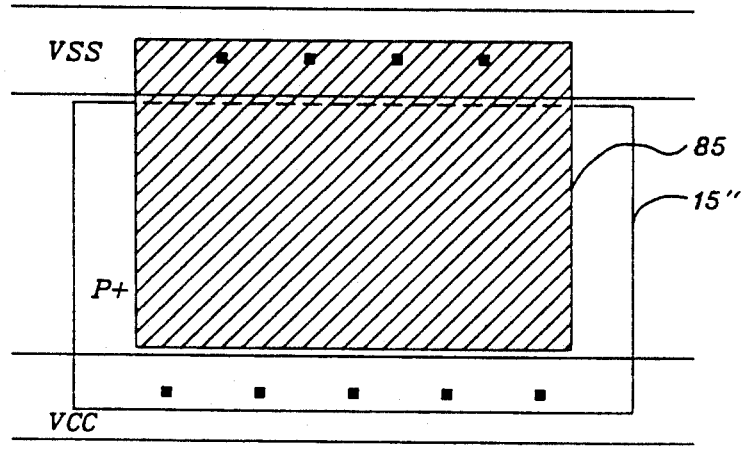
Figure 8:
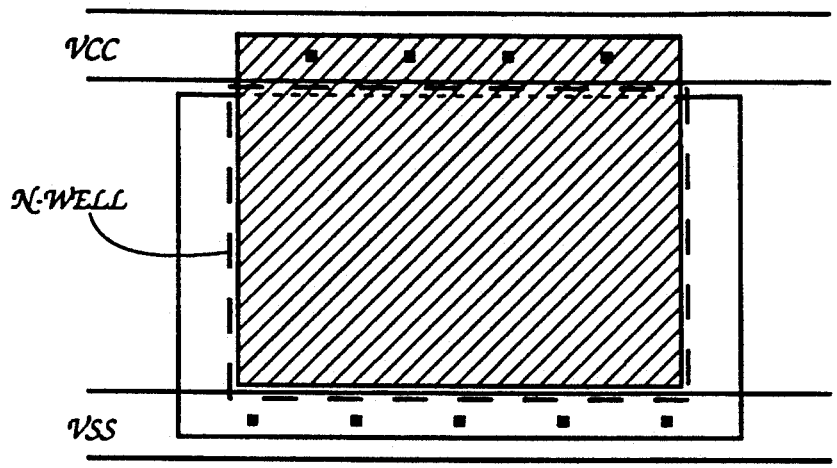
FIGS. 8 and 9 show arrangements for depletion mode capacitors.
Figure 9:
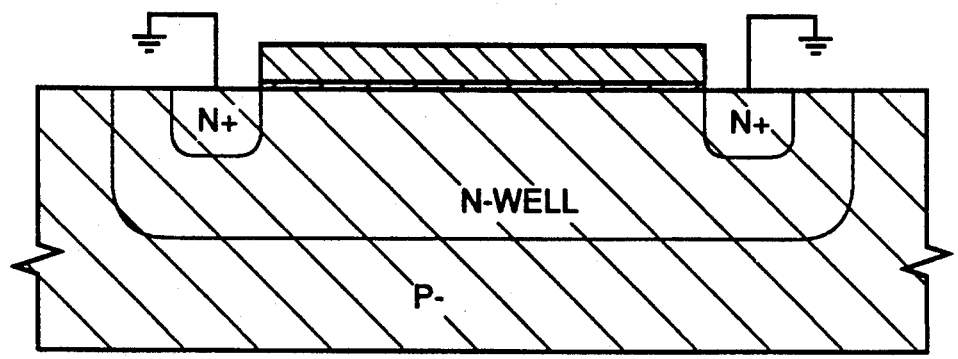

The present embodiment contemplates the use of N channel capacitors, with $V_{ss}$ connected to active area 15' and $V_{cc}$ connected to poly 75. This is shown in FIG. 6. It is possible to construct P channel capacitors, with $V_{cc}$ connected to active area 15" and $V_{ss}$ connected to poly 85. This is shown in FIG. 7. In one embodiment each of these is an enhancement mode capacitor, which has a preferential voltage polarity. In an alternate embodiment, shown in FIGS. 8 and 9, they may be depletion mode capacitors, which have less preferential voltage polarity. Depletion mode capacitors are defined by an active area of the substrate and a polysilicon layer.

Figure 10:
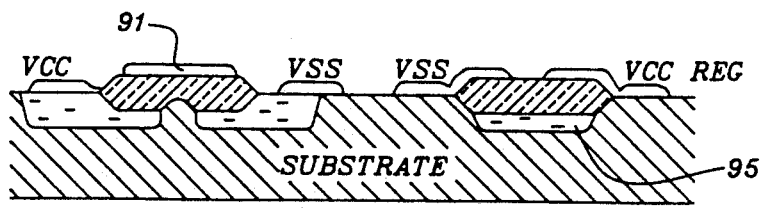
FIG. 10 shows a cross-sectional view of an arrangement in which two capacitors are connected in series in order to increase breakdown voltage.

It may also be the case that two capacitors may be connected in series in order to increase the total breakthrough voltage of the combined capacitors. Enhancement mode capacitors require adjustment for their preferential voltage polarity. This can be accomplished through interconnects or similar means. Depletion mode capacitors, on the other hand, have less preferential voltage polarity. If the capacitors are not polarization sensitive, then the capacitors can have a common poly plate 91 or a common active area 95, as schematically shown in FIG. 10.

We claim:

1. A semiconductor dynamic random access memory (DRAM) circuit device in which a plurality of active circuit devices are arrayed on a semiconductive substrate and a plurality of conductive lines extend along the substrate between the active devices and external connection points on a die containing the semiconductor substrate, within a package containing external connection conductors extending within the package from the external connection points and having significant inductive characteristics, characterized by:
   (a) a capacitor defined by an active area of the substrate and a polysilicon layer, said capacitor being a depletion mode capacitor;
   (b) the capacitor including a bottom plate and a top plate, the bottom plate consisting of a doped region of substrate which is doped to include minority carriers of a given conductivity type, with contacts of the bottom plate including a portion of the substrate, said portion being further doped to be more heavily doped to be of said given conductivity type than other portions of the doped region of the substrate, the top plate being formed of conductive material extending across said doped region of the substrate between said portions;
   (c) the capacitor occupying a space defined by a plurality of the conductive lines; and
   (d) the capacitor being in electrical communication with at least one of said lines, wherein the capacitor is located on the substrate in an area which is unoccupied by said active circuit devices, wherein one node is tied directly to substrate and the other node directly to $V_{cc}$ power bus, to achieve an on-chip power bus decoupling capacitor with capacitance in excess of 0.001 $\mu$F, thereby adding filter capacitance to the semiconductor circuit device in order to provide protection from voltage transients which may occur at the external connection points as a result of said inductive characteristics of the external connection conductors.

2. Semiconductor circuit device as described in claim 1, further characterized by:
   the capacitor being in electrical communication between two of said conductive lines, wherein both of said lines remains in electrical communication with the external connection points wherein the capacitor filters inductively induced transients on the semiconductor device during the operation of the semiconductor circuit device.

3. Semiconductor circuit device as described in claim 1, further characterized by:
   the semiconductor circuit device including a randomly accessed memory array, in which stored data is communicated by high and low state signals and said capacitor is connected between a $V_{ss}$ circuit and a $V_{cc}$ circuit.

4. Semiconductor circuit device as described in claim 1, further characterized by:
   said conductive lines being circuit busses for circuits on the semiconductor device.

5. Semiconductor circuit device as described in claim 4, further characterized by:
   said conductive lines being metal conductors.

6. Semiconductor circuit device as described in claim 1, further characterized by:
   (a) said active circuit devices and said conductive lines being located o a face side of the substrate of the semiconductor circuit device; and
   (b) said capacitor being located on the face side.

7. Semiconductor circuit device as described in claim 6, further characterized by:
   said capacitor being located on a portion of the semiconductor circuit device which is at a perimeter of the substrate.

8. Semiconductor circuit device as described in claim 6, further characterized by:

said capacitor being located on a portion of the semiconductor circuit device which is in a border area between adjacent regions of active circuitry on the semiconductor device.

9. Semiconductor circuit device as described in claim 6, further characterized by
   (a) one of said conductive lines being maintained at a regulated potential;
   (b) an additional capacitor located on the substrate in an area which is unoccupied by said active circuit device and connected in series with said capacitor in electrical communication with said conductive line which is maintained at the regulated potential.

10. Semiconductor circuit device as described in claim 6, further characterized by:
    (a) one of said conductive lines being maintained at a regulated potential;
    (b) an additional capacitor located on the substrate in an area which is unoccupied by said active circuit device and connected in series with said capacitor in electrical communication with said conductive line which is maintained at the regulated potential;
    (c) the additional capacitor sharing a common electrode plate which extends across said unoccupied area between the two capacitors; and
    (d) said capacitors being depletion mode capacitors.

11. Semiconductor circuit device as described in claim 5, further characterized by:
    (a) one of said conductive lines being maintained at a regulated potential;
    (b) an additional capacitor located on the substrate in an area which is unoccupied by said active circuit device and connected in series with said capacitor in electrical communication with said conductive line which is maintained at the regulated potential; and
    (c) the additional capacitor sharing a common active area which extends across said unoccupied area between the two capacitors.

12. Semiconductor circuit device as described in claim 11, further characterized by:
    said capacitors being depletion mode capacitors.

13. A semiconductor dynamic random access memory (DRAM) circuit device in which a plurality of active circuit devices are arrayed on a semiconductive substrate and a plurality of conductive lines extend along the substrate between the active devices and external connection points on a die, containing the semiconductor substrate, within a package containing external connection conductors extending within the package from the external connection points and having significant inductive characteristics, characterized by:
    (a) a voltage regulator circuit;
    (b) a regulated conductive line extending along the substrate between an active device and the voltage regulator circuit;
    (c) a capacitor defined by an active area of the substrate as a bottom plate and a polysilicon layer as a top plate, said capacitor being a depletion mode capacitor;
    (d) the bottom plate consisting of a doped to be of the same conductivity type as the doped region of the substrate, and more heavily doped the than other portions of the doped region of the substrate, the top plate extending across said doped region of substrate between said portions;
    (e) the capacitor occupying a space defined by a plurality of the conductive lines; and
    (f) the capacitor being in electrical communication with said regulated conductive line, wherein the capacitor is located on the substrate in an area which is unoccupied by said active circuit devices, wherein one node is tied directly to substrate and the other node to the regulated conductive line as an on-chip power bus decoupling capacitor, thereby adding filter capacitance to the semiconductor circuit device in order to provide protection from voltage transients which may occur at the external connection points as a result of said inductive characteristics of the external connection conductors.

14. Semiconductor circuit device as described in claim 13, further characterized by:
    said conductive lines being metal conductors.

15. Semiconductor circuit device as described in claim 14, further characterized by:
    (a) said active circuit devices and said conductive lines being located o a face side of the substrate of the semiconductor circuit device; and
    (b) said capacitor being located on the face side.

16. Semiconductor circuit device as described in claim 15, further characterized by:
    said capacitor being located on a portion of the semiconductor circuit device which is at a perimeter of the substrate.

17. Semiconductor circuit device as described in claim 15, further characterized by:
    said capacitor being located on a portion of the semiconductor circuit device which is in a border area of active circuitry on the semiconductor device.

18. Semiconductor circuit device as described in claim 13, further characterized by:
    (a) an additional capacitor located on the substrate in an area which is unoccupied by said active circuit device and connected in series with said capacitor in electrical communication with said regulated conductive line; and
    (b) the additional capacitor sharing a common electrode plate which extends across said unoccupied area between the two capacitors.

19. A semiconductor circuit device in which a plurality of active circuit devices are arrayed on a semiconductive substrate and a plurality of conductive lines extend along the substrate between the active devices and external connection points on a die containing the semiconductor substrate, within a package containing external connection conductors extending within the package from the external connection points and having significant inductive characteristics, characterized by:
    (a) a capacitor defined by an active area of the substrate as a bottom plate and a polysilicon layer as a top plate;
    (b) the capacitor being a depletion mode capacitor occupying a space defined by a plurality of the conductive lines, one of said conductive lines being connected, as a regulated conductive line, to a voltage regulating circuit;
    (c) the bottom plate consisting of a doped region of the substrate which is doped to include minority carriers of a given conductivity type, with contacts of the bottom plate including a portion of the substrate, said portion being further doped to be of the same conductivity type as the doped region of the substrate, and more heavily doped the than other portions of the doped region of the substrate, the top plate extending across said doped region of the substrate between said portions;

(d) the capacitor being in electrical communication with at least one of said lines, wherein the capacitor is located on the substrate in an area which is unoccupied by said active circuit devices, wherein one node is tied directly to substrate and the other node to the regulated conductive line as an on-chip power bus decoupling capacitor, thereby adding filter capacitance to the semiconductor circuit device in order to provide protection from voltage transients which may occur at the external connection points as a result of said inductive characteristics of the external connection conductors.

20. Semiconductor circuit device as described in claim 19, further characterized by:

the capacitor being in electrical communication between two of said conductive lines, wherein both of said lines remain in electrical communication with the external connection points wherein the capacitor filters inductively induced transients on the semiconductor device during the operation of the semiconductor circuit device.

21. Semiconductor circuit device as described in claim 19, further characterized by:

said conductive lines being metal conductors.

22. Semiconductor circuit device as described in claim 19 further characterized by:

(a) said active circuit devices and said conductive lines being located on a face side of the substrate of the semiconductor circuit device;

(b) said capacitor being located on the face side; and (c) said capacitor being located on a portion of the semiconductor circuit device which is at a perimeter of the substrate.

23. Semiconductor circuit device as described in claim 19, further characterized by:

(a) said active circuit devices and said conductive lines being located on a face side of the substrate of the semiconductor circuit device;

(b) said capacitor being located on the face side; and (c) said capacitor being located on a portion of the semiconductor circuit device which is in a border area between adjacent regions of active circuitry on the semiconductor device.

24. Semiconductor circuit device as described in claim 19, further characterized by:

an additional capacitor located on the substrate in an area which is unoccupied by said active circuit device and connected in series with said capacitor in electrical communication with said regulated conductive line.

25. Semiconductor circuit device as described in claim 19, further characterized by:

(a) an additional capacitor located on the substrate in an area which is unoccupied by said active circuit device and connected in series with said capacitor in electrical communication with said regulated conductive line; and (b) the additional capacitor having a bottom plate which shares a common active area which extends across said unoccupied area.

* * * * *